United States Patent
Tsubuku et al.

(10) Patent No.: US 11,973,161 B2
(45) Date of Patent: *Apr. 30, 2024

(54) PHOTO SENSOR DEVICE

(71) Applicant: Japan Display Inc., Tokyo (JP)

(72) Inventors: Masashi Tsubuku, Tokyo (JP);
Takanori Tsunashima, Tokyo (JP);
Marina Mochizuki, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/091,388

(22) Filed: Dec. 30, 2022

(65) Prior Publication Data

US 2023/0137257 A1    May 4, 2023

Related U.S. Application Data

(63) Continuation of application No. 17/527,192, filed on Nov. 16, 2021, now Pat. No. 11,575,062, which is a
(Continued)

(30) Foreign Application Priority Data

Mar. 20, 2018    (JP) ................. 2018-052337

(51) Int. Cl.
*H01L 31/12* (2006.01)
*G06F 1/16* (2006.01)
*H01L 31/101* (2006.01)

(52) U.S. Cl.
CPC .......... *H01L 31/125* (2013.01); *G06F 1/1605* (2013.01); *H01L 31/1016* (2013.01)

(58) Field of Classification Search
CPC ............. H01L 31/125; H01L 31/1016; H01L 27/1255; H01L 27/0629; H01L 27/0676;
(Continued)

(56) References Cited

U.S. PATENT DOCUMENTS 8,194,469 B2    6/2012    Tanaka et al.
9,419,610 B2    8/2016    Ahn et al.
(Continued)

FOREIGN PATENT DOCUMENTS

JP    2009-182194 A    8/2009
JP    2011-243950 A    12/2011
(Continued)

OTHER PUBLICATIONS

International Search Report and Written Opinion dated Jun. 4, 2019 for PCT/JP2019/009306 filed on Mar. 8, 2019, 8 pages.

*Primary Examiner* — Calvin Y Choi
(74) *Attorney, Agent, or Firm* — XSENSUS LLP

(57) ABSTRACT

A photo sensor circuit includes: a photo transistor; a first switching transistor; a second switching transistor; and a capacitance element. The photo transistor includes: a gate connected to a first wiring; a source connected to a second wiring; and a drain. The first switching transistor includes: a gate connected to a third wiring; a source connected to a fourth wiring; and a drain connected to the drain of the photo transistor. The capacitance element includes: a first terminal connected to the drain of the photo transistor; and a second terminal connected to the source of the first switching transistor. The second switching transistor includes: a gate connected to a gate line; a source connected to a signal line; and a drain connected to the first terminal of the capacitance element. The photo transistor, first switching transistor, and second transistor each include an oxide semiconductor layer as a channel layer.

7 Claims, 15 Drawing Sheets

Related U.S. Application Data continuation of application No. 17/024,725, filed on Sep. 18, 2020, now Pat. No. 11,189,745, which is a continuation of application No. PCT/JP2019/009306, filed on Mar. 8, 2019.

(58) Field of Classification Search
CPC ............ H01L 27/0682; H01L 27/0716; H01L 27/0722; H01L 27/0727; H01L 27/0733; H01L 27/0788; H01L 27/0794; H01L 27/0805; H01L 27/101; H01L 27/3265
USPC ........................................................ 257/431
See application file for complete search history.

(56) References Cited

U.S. PATENT DOCUMENTS

| | | | |
|---|---|---|---|
| 11,189,745 B2 * | 11/2021 | Tsubuku | ................. G06F 3/042 |
| 11,575,062 B2 * | 2/2023 | Tsubuku | ................... G09F 9/00 |
| 2012/0056861 A1 | 3/2012 | Kurokawa et al. | |
| 2012/0138919 A1 | 6/2012 | Lan et al. | |
| 2015/0311245 A1 | 10/2015 | Yamazaki et al. | |
| 2016/0291714 A1 | 10/2016 | Wu et al. | |
| 2016/0343305 A1 | 11/2016 | Kamiyamaguchi et al. | |

FOREIGN PATENT DOCUMENTS

| JP | 2012-256819 A | 12/2012 |
|---|---|---|
| JP | 2015-216369 A | 12/2015 |
| WO | 2015/111118 A | 7/2015 |

* cited by examiner

PHOTO SENSOR DEVICE

CROSS-REFERENCE TO RELATED APPLICATIONS

This application is a continuation of U.S. application Ser. No. 17/527,192, filed Nov. 16, 2021, which is a continuation of U.S. application Ser. No. 17/024,725, filed Sep. 18, 2020 (now U.S. Pat. No. 11,189,745), which is a continuation application of International Application No. PCT/JP2019/009306, filed on Mar. 8, 2019, which claims priority to Japanese Patent Application No. 2018-052337, filed on Mar. 20, 2018. The contents of these applications are incorporated herein by reference in their entirety.

TECHNICAL FIELD

The present invention relates to light sensor circuits or photo sensor circuits, and more particularly the present invention can be applied to a light sensor circuit (or a photo sensor circuit), a light sensor device (or a photo sensor device), and a display device each of which uses oxide semiconductors.

BACKGROUND ART

Japanese Patent Application Laid-Open No. 2011-243950 (PLT 1) and Japanese Patent Application Laid-Open No. 2009-182194 (PLT2), in which photo sensing circuits and photo sensor elements using oxide semiconductors are disclosed, are proposed.

CITATION LIST

Patent Literature

PLT 1: Japanese Patent Application Laid-Open No. 2011-243950
PLT 2: Japanese Patent Application Laid-Open No. 2009-182194

SUMMARY OF INVENTION

Technical Problem

An oxide semiconductor transistor has a degradation mode that is referred to as light negative bias degradation in which the threshold voltage of the oxide semiconductor transistor greatly changes when a negative bias is applied to the oxide semiconductor while being irradiated with light. In addition, an oxide semiconductor transistor has a characteristic that, if once the oxide semiconductor transistor is irradiated with light, the drain current of the oxide semiconductor transistor decreases very slowly even after the irradiation of the light is stopped. Therefore, there is a problem that it is difficult to use an oxide semiconductor transistor as a photo sensor element.

An object of the present invention is to provide a photo sensor circuit that uses oxide semiconductor transistors and the operation of which is stable.

Problems other than the above and new features will be explicitly shown by the descriptions of this specification and the accompanying drawings.

Solution to Problem

The outlines of typical aspects according to the present invention can briefly be described as follows.

To put it concretely, a photo sensor circuit includes: a photo transistor; a first switching transistor; a second switching transistor; and a capacitance element. The photo transistor includes: a gate connected to a first wiring; a source connected to a second wiring; and a drain. The first switching transistor includes: a gate connected to a third wiring; a source connected to a fourth wiring; and a drain connected to the drain of the photo transistor. The capacitance element includes: a first terminal connected to the drain of the photo transistor; and a second terminal connected to the source of the first switching transistor. The second switching transistor includes: a gate connected to a gate line; a source connected to a signal line; and a drain connected to the first terminal of the capacitance element. Each of the photo transistor, the first switching transistor, and the second transistor includes an oxide semiconductor layer as a channel layer.

Furthermore, a photo sensor device includes: plural gate lines; plural signal lines; and plural photo sensor circuits connected to the plural gate lines and the plural signal lines in such a way that each of the plural photo sensor circuits is connected to one of the plural gate lines and one of the plural signal lines. Each of the plural photo sensor circuits includes: a photo transistor; a first switching transistor; a second switching transistor; and a capacitance element. The photo transistor includes: a gate connected to a first wiring; a source connected to a second wiring; and a drain. The first switching transistor includes: a gate connected to a third wiring; a source connected to a fourth wiring; and a drain connected to the drain of the photo transistor. The capacitance element includes: a first terminal connected to the drain of the photo transistor; and a second terminal connected to the source of the first switching transistor. The second switching transistor includes: a gate connected to the relevant gate line; a source connected to the relevant signal line; and a drain connected to the first terminal of the capacitance element. Each of the photo transistor, the first switching transistor, and the second transistor includes an oxide semiconductor layer as a channel layer.

Furthermore, a display device includes a display panel having a display region. The display region includes display pixels and a photo sensor circuit. The photo sensor circuit includes: a photo transistor; a first switching transistor; a second switching transistor; and a capacitance element. The photo transistor includes: a gate connected to a first wiring; a source connected to a second wiring; and a drain. The first switching transistor includes: a gate connected to a third wiring; a source connected to a fourth wiring; and a drain connected to the drain of the photo transistor. The capacitance element includes: a first terminal connected to the drain of the photo transistor; and a second terminal connected to the source of the first switching transistor. The second switching transistor includes: a gate connected to a gate line; a source connected to a signal line; and a drain connected to the first terminal of the capacitance element. Each of the photo transistor, the first switching transistor, and the second transistor includes an oxide semiconductor layer as a channel layer.

DESCRIPTION OF EMBODIMENTS

Hereinafter, the respective embodiments of the present invention will be explained in reference to the accompanying drawings.

Here, the present disclosures are mere examples, and it is to be understood that appropriate modifications, which can be easily come up with by those skilled in the art without deviating from the gist of the present invention, fall within the scope of the present invention. In addition, there are some cases where, in the accompanying drawings, the widths, thicknesses, shapes, and the like of respective portions of the embodiments are schematically depicted differently from what the embodiments really are, but these depictions are mere examples, so that the interpretation of the present invention is not limited to these depictions.

In addition, in this specification and the accompanying drawings, the same components as components that have appeared in already-described drawings are given the same reference signs, and detailed explanations about them may be omitted accordingly.

EXAMPLE (Element Structure of Photo Sensor Element)

Figure 1:
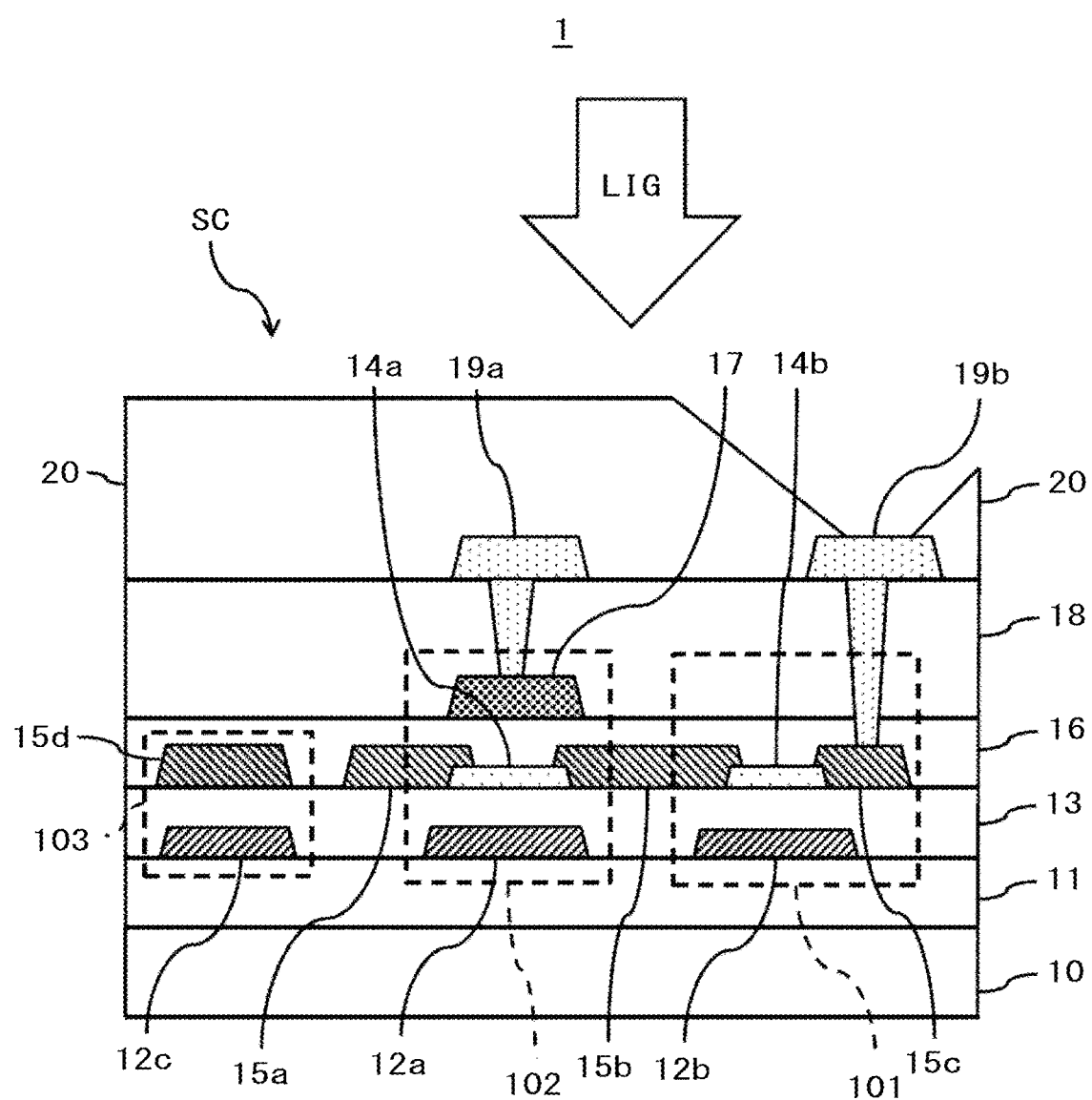
FIG. 1 is a cross-sectional view for schematically explaining the illustrative structure of an oxide semiconductor transistor used for a photo sensor device according to an example.
Figure 2:
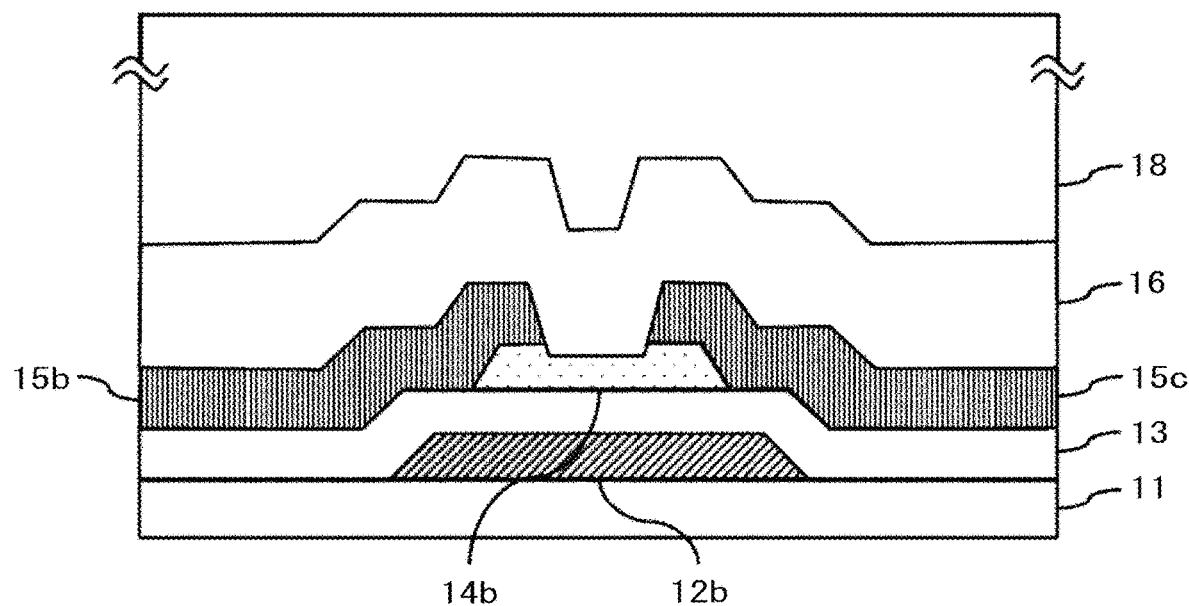
FIG. 2 is a cross-sectional view for schematically explaining the illustrative structure of a photo transistor shown in FIG. 1.
Figure 3:
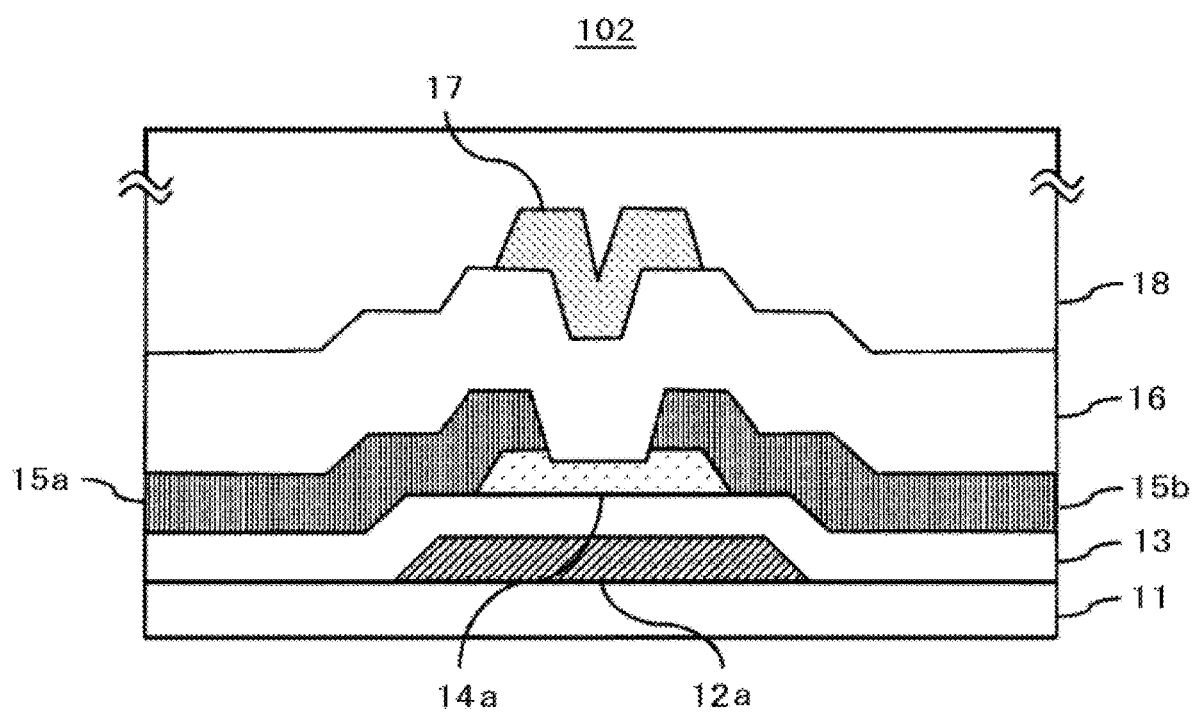
FIG. 3 is a cross-sectional view for schematically explaining the illustrative structure of a switching transistor shown in FIG. 1.

FIG. 1 is a cross-sectional view for schematically explaining the illustrative structure of an oxide semiconductor transistor used for a photo sensor device according to an example. FIG. 2 is a cross-sectional view for schematically explaining the illustrative structure of a photo transistor 101 shown in FIG. 1. FIG. 3 is a cross-sectional view for schematically explaining the illustrative structure of a switching transistor 102 shown in FIG. 1.

A photo sensor device 1 according to the example includes plural photo sensor circuits SC. In FIG. 1, one photo transistor 101, one switching transistor 102, and a capacitance element 103, which are used in each photo sensor circuit SC, are illustratively depicted. Both the photo transistor 101 and the switching transistor 102 are formed using oxide semiconductor transistors.

The photo transistor 101 includes, as shown in FIG. 1 and FIG. 2, a gate electrode 12b, an oxide semiconductor layer 14b, a drain electrode 15b, and a source electrode 15c. To put it concretely, the photo transistor 101 is an element having a lower gate structure in which a gate electrode 12b is formed to the lower side of the oxide semiconductor layer 14b, that is, a bottom gate type three terminal (a gate, a source, and a drain) element, and the photo transistor 101 has a bottom-gate top-contact structure (also referred to an inverted staggered structure).

The switching transistor 102 includes, as shown in FIG. 1 and FIG. 3, a gate electrode 12a, an oxide semiconductor layer 14a, a source electrode 15a, the drain electrode 15b, and a back gate electrode 17. In other words, the switching transistor 102 is a bottom gate type four terminal (a gate, a source, a drain, and a back gate) element, so that the switching transistor 102 has a configuration in which the back gate electrode 17 is added to an inverted staggered structure. For example, the switching transistor 102 can be formed as a dual gate drive element in which both gate electrode 12a and back gate electrode 17 are driven. In addition, it is also conceivable that the switching transistor 102 is configured in such a way that the back gate electrode 17 is connected to the source electrode 15a. The structure of the switching transistor 102 is not limited to the bottom gate type structure, but the structure can also be a top gate type structure. Here, the top gate type structure is a structure in which the gate electrode 12a is formed to the upper side of the oxide semiconductor layer 14a.

The capacitance element 103 is composed of a gate electrode 12c, a source or drain electrode 15d, and a gate insulating film 13. The capacitance element is composed of not only the above components, but also can be composed of the gate electrode 12c, an oxide semiconductor layer, which is formed at the same time as the oxide semiconductor layers 14a and 14b are formed, and the gate insulating film 13. Furthermore, the capacitance element 103 can be composed of the source or drain electrode 15d, a metal layer, which is formed at the same time as the back gate electrode 17 is formed, and an insulating layer 16.

The oxide semiconductor layers 14a and 14b form the channel layers (active layers) of the oxide semiconductor transistors (101, 102), and the materials of the oxide semiconductor layers 14a and 14b can include oxide semiconductor materials such as ZnO-based materials. The ZnO-based materials can include, for example, ZnO or can include mixtures or compounds formed by ZnO including at least one material of Hf, Y, Ta, Zr, Ti, Cu, Ni, Cr, In, Ga, Al, Sn, and Mg. For example, such ZnO-based materials can include: ZnO; TaZnO; InZnO (IZO); or GaInZnO (Gallium Indium Zinc Oxide; GIZO).

Because such an oxide semiconductor transistor has a characteristic in which its threshold voltage and drain current vary in accordance with the light amount of incoming light LIG, the oxide semiconductor transistor can be used as the photo transistor 101. Here, because it is unnecessary that the switching transistor 102 has a characteristic in which its threshold voltage and drain current vary in accordance with the light amount of the incoming light LIG, the gate electrode 12a is formed to the lower side of the oxide semiconductor layer 14a and the back gate electrode 17 is formed to the upper side of the oxide semiconductor layer 14a as shown in FIG. 1 and FIG. 3. With this, the switching transistor 102 is configured in such a way that the oxide semiconductor layer 14a of the switching transistor 102 is not irradiated with the incoming light LIG. In other words, the back gate electrode 17 has a role of shielding or blocking the incoming light LIG into the oxide semiconductor layer 14a.

As shown in FIG. 1, the photo sensor device 1 includes: a substrate 10; an insulating layer 11 formed so as to wholly cover the substrate 10; the gate electrodes 12a, 12b, and 12c formed on parts of the insulating layer 11 respectively; and the gate insulating film 13 formed over the insulating layer 11 and the gate electrodes 12a, 12b, and 12c so as to cover the side surfaces and upper surfaces of the gate electrodes 12a, 12b, and 12c. The photo sensor device 1 further includes: the oxide semiconductor layers 14a and 14b formed on parts of the gate insulating film 13; the source electrodes and drain electrodes 15a, 15b, 15c, and 15d formed so as to cover both side surfaces of the oxide semiconductor layer 14a and both side surfaces of the oxide semiconductor layer 14b; and the transparent insulating layer 16 formed so as to wholly cover the source electrodes and drain electrodes 15a, 15b, 15c, and 15d and the oxide semiconductor layers 14a and 14b. The photo sensor device 1 further includes: the back gate electrode 17 formed on a part of the transparent insulating layer 16 so as to cover the oxide semiconductor layer 14a; a transparent insulating layer 18 formed as a flattening film so as to wholly cover the upper surface of the back gate electrode 17 and the upper surface of the transparent insulating layer 16; wiring layers 19a and 19b formed on parts of the transparent insulating layer 18; and a transparent insulating layer 20 formed as a passivation film so as to wholly cover the upper surfaces of the wiring layers 19a and 19b and the upper surface of the transparent insulating layer 18. Here, the wiring layer 19a is connected to the back gate electrode 17 through a via electrode, and the wiring layer 19b is connected to the source electrode 15c through a via electrode.

The substrate 10 can be formed by using a typical substrate material such as glass, silicon, or a resin. The insulating layer 11, the gate insulating film 13, the transparent insulating layer 16, the transparent insulating layer 18, and the transparent insulating layer 20 can be formed using materials made of silicon oxide films. The films of the insulating layer 11, the gate insulating film 13, the transparent insulating layer 16, the transparent insulating layer 18, and the transparent insulating layer 20 can be formed using a CVD method. The gate electrodes 12a, 12b, and 12c, the source and drain electrodes 15a, 15b, 15c, and 15d, the back gate electrode 17, the wiring layers 19a and 19b can be formed using conductive metals or conductive metal oxides. The films of the oxide semiconductor layers 14a and 14b can be formed using a sputtering method.

For example, in the case where the photo sensor device 1 is used for a photo touch panel or a fingerprint sensor that are attached on a display panel, the gate electrodes 12a, 12b, and 12c and the source electrodes and drain electrodes 15a, 15b, 15c, and 15d can be formed using transparent conductive materials such as ITO. Here, as shown in FIG. 1, in the case of an upper surface irradiation scheme where the upper surface of the photo sensor device 1 is irradiated with the incoming light LIG, because the back gate electrode 17 has a role of shielding or blocking the irradiation of the incoming light LIG into the oxide semiconductor layer 14a, it is preferable to form the back gate electrode 17 using a nontransparent material. On the other hand, in the case of a rear surface irradiation scheme where the rear surface of the photo sensor device 1, that is, the substrate 10 is irradiated with the incoming light LIG, because the gate electrode 12c has a role of shielding or blocking the irradiation of the incoming light LIG into the oxide semiconductor layer 14a, it is preferable to form the gate electrode 12c using a nontransparent material.

Figure 4:
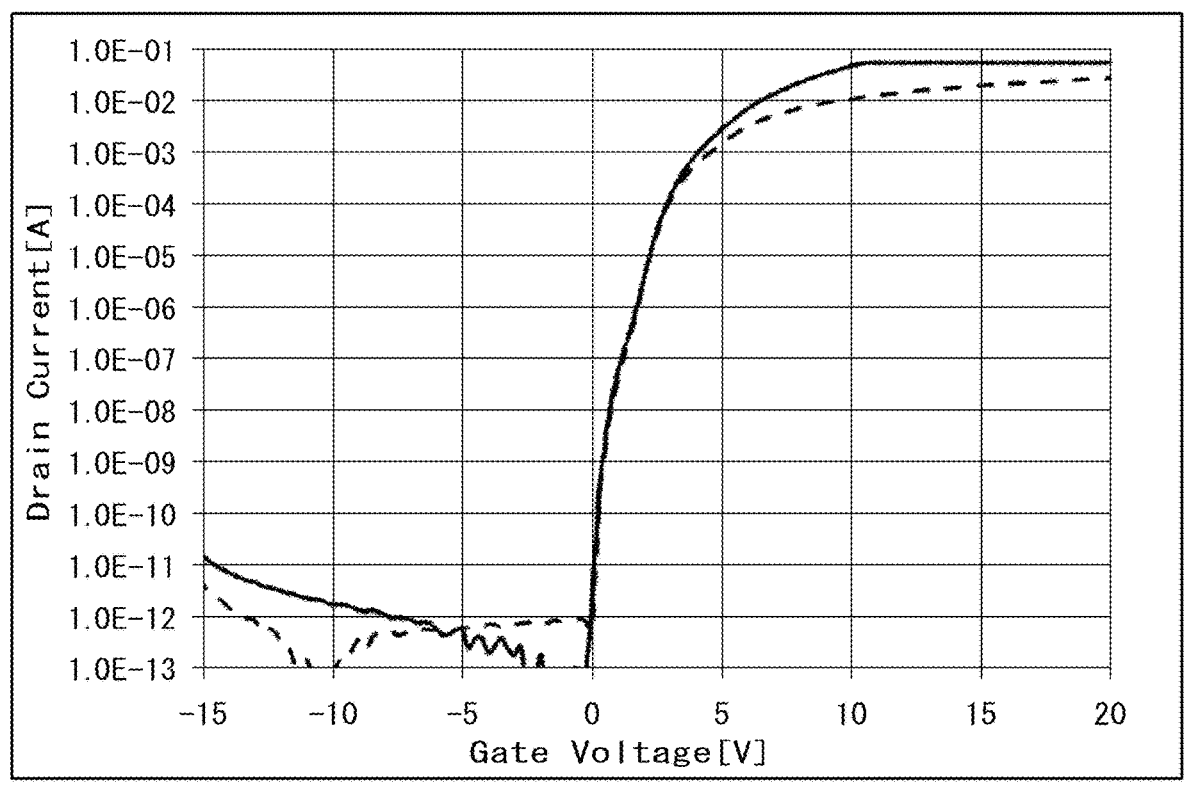
FIG. 4 is a diagram showing the characteristics of the drain current of the photo transistor without light irradiation.
Figure 5:
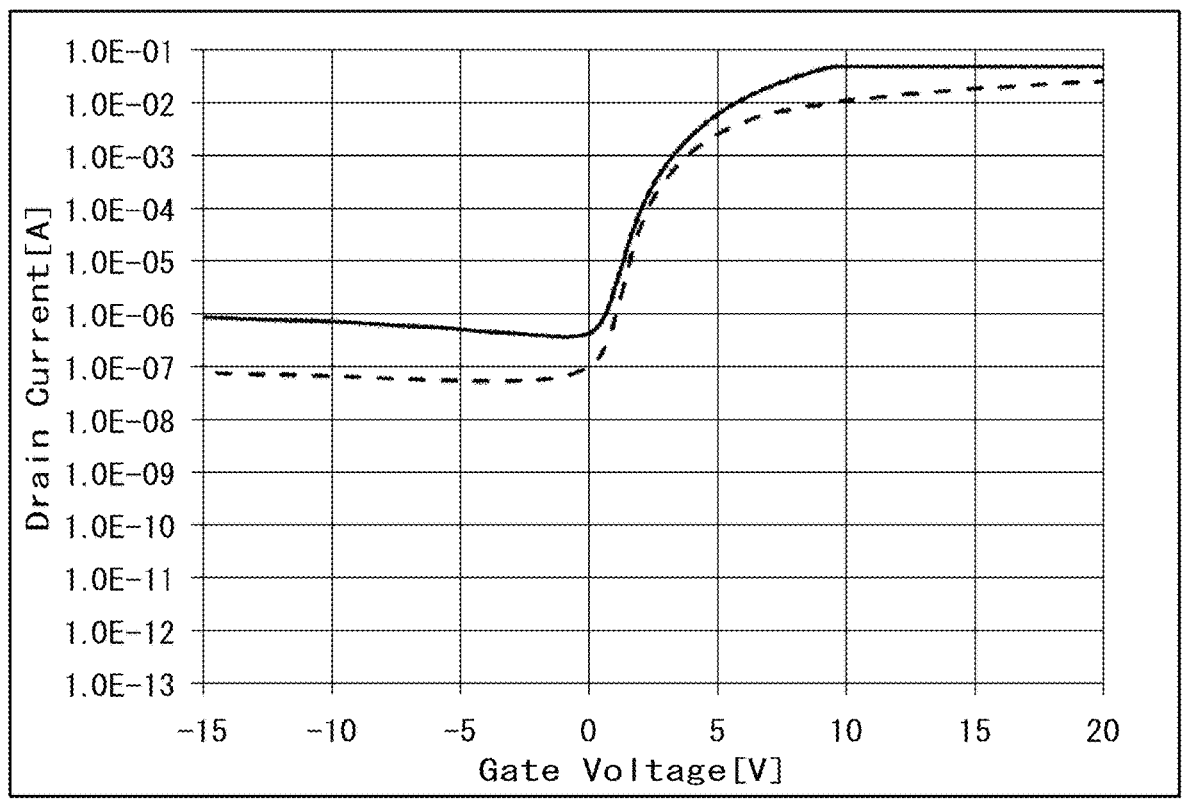
FIG. 5 is a diagram showing the characteristics of the drain current of the photo transistor with light irradiation.

FIG. 4 is a diagram showing the characteristics of the drain current of the photo transistor 101 without light irradiation. FIG. 5 is a diagram showing the characteristics of the drain current of the photo transistor 101 with light irradiation. In FIG. 4 and FIG. 5, the vertical axis represents the value of the drain current of the photo transistor 101, and the horizontal axis represents the value of the gate voltage of the photo transistor 101. Here, characteristics shown in dashed lines show those in the case of the drain voltage being 1 V, and characteristics shown in solid lines show those in the case of the drain voltage being 10 V.

As can be understood from FIG. 4, in the case of the absence of light irradiation, in a region where the gate potential of the photo transistor 101 is equal to or less than a threshold potential, that is, in an off-region where the photo transistor 101 is in an off-state (nonconductive), the values of the drain currents are very small, that is, equal to or less than a measurable lower limit. Contrarily, as can be understood from FIG. 5, in the case of the presence of light irradiation, in the region where the gate potential of the photo transistor 101 is equal to or less than the threshold potential, that is, in the off-region where the photo transistor 101 is in an off-state (nonconductive), the values of the drain currents become much larger in comparison with those in FIG. 4.

Because the photo transistor 101 according to the present invention has a three-terminal structure as mentioned above, the values of the drain currents of the photo transistor 101 in an off-state (also referred to as off-currents) can be used for judging whether there is light irradiation or not as shown in FIG. 4 and FIG. 5. This is because it becomes possible to detect whether there is light irradiation or not in a stable way by utilizing the fact that the signal ratios of the off-currents of the photo transistor 101 in the case of the presence of light irradiation to the off-currents in the case of the absence of light irradiation are large.

As mentioned above, an oxide semiconductor transistor has a degradation mode that is referred to as light negative bias degradation in which the threshold voltage of the oxide semiconductor transistor greatly changes when a negative bias is applied to the oxide semiconductor transistor while being irradiated with light. In particular, a trade-off, in which the optical degradation of the oxide semiconductor transistor is accelerated as the optical sensitivity of the oxide semiconductor transistor is increased, becomes a problem. On the other hand, because the off-current of an oxide semiconductor transistor is very small, it becomes possible to obtain the sufficient large signal ratios of off-currents in the case of the presence of light irradiation to off-currents in the case of the absence of light irradiation by making the photo transistor 101 have a three-terminal structure and operate in the off-region.

In addition, the amount of light irradiation between the photo transistor 101 and the switching transistor 102 can be controlled by changing the positions of the gates of the elements 101 and 102 and the position of the back gate electrode. With this, it becomes possible to detect whether there is light irradiation or not in a stable way.

Furthermore, because the optical degradation of the oxide semiconductor transistor shifts its threshold in the negative direction, it becomes possible to reduce an influence on the negative change of its threshold by making a negative potential applied to the gate electrode at the time of the oxide semiconductor transistor being in an off-state large.

Next, the illustrative circuit configuration example of the photo sensor circuit using the photo transistor 101, the switching transistor 102, and the capacitance element 103 explained in FIG. 1 to FIG. 3 will be explained.
(Circuit Configuration of Photo Sensor Circuit)

Figure 6:
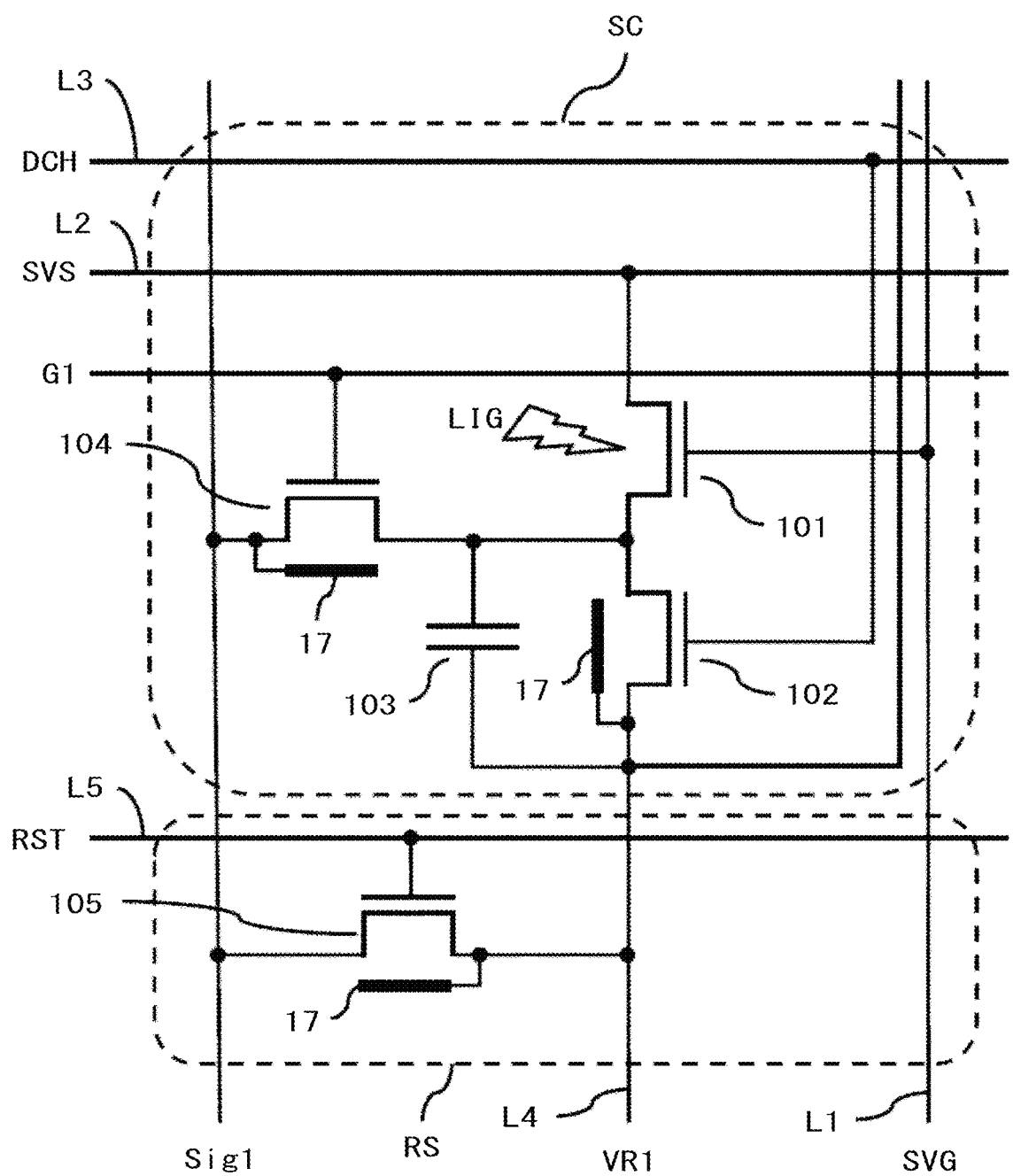
FIG. 6 is a circuit diagram for explaining the illustrative configuration example of a photo sensor circuit according to the example.

FIG. 6 is a circuit diagram for explaining the illustrative configuration example of the photo sensor circuit according to the example.

The photo sensor circuit SC includes a photo transistor 101 that is a light receiving element, a switching transistor 102, a switching transistor 104, and a capacitance element 103. In addition, a reset circuit RS connected to the photo sensor circuit SC is depicted in FIG. 6. The reset circuit RS includes a switching transistor 105.

Here, each of the switching transistors 104 and 105 is formed by an oxide semiconductor transistor having a back gate electrode 17 as is the case with the switching transistors 102 explained in FIG. 1 and FIG. 3. In FIG. 6, each of the switching transistors 102, 104, and 105 is configured for its back gate electrode 17 to be connected to its source electrode. The switching transistors 102, 104, and 105 are sometimes referred to as a first switching transistor, a second switching transistor, and a third switching transistor respectively.

The photo transistor 101 includes: a gate connected to a wiring (a first wiring) L1 to which a first gate control signal SVG is supplied; a source connected to a wiring (a second wiring) L2 to which a first source control signal SVS is supplied; and a drain. The switching transistor 102 includes: a gate connected to a wiring (a third wiring) L3 to which a second gate control signal DCH is supplied; a source connected to a wiring (a fourth wiring) L4 to which a second source control signal VR1 is supplied; and a drain connected to the drain of the photo transistor 101. The capacitance element 103 includes: a first terminal connected to the drain of the photo transistor 101; and a second terminal connected to the source of the switching transistor 102. The switching transistor 104 includes: a gate connected to a gate line G1; a source connected to a signal line Sig1; and a drain connected to the first terminal of the capacitance element 103.

The capacitance element 103 has a function for storing charge in accordance with irradiated light amount when the photo transistor 101 is irradiated with the incoming light LIG. The charge stored in the capacitance element 103 is read out to the signal line Sig1 through the source-drain channel of the switching transistor 104 that is turned on when the gate line G1 is set in a selective level.

The reset circuit RS includes the switching transistor 105. The switching transistor 105 includes: a gate connected to a wiring (a fifth wiring) L5 to which a reset signal RST is supplied; a source connected to the wiring L4 to which the second source control signal VR1 is supplied; and a drain connected to the Sig1. Here, in the case where plural photo sensor circuits SC are formed, the wiring L4 to which the second source control signal VR1 is supplied is connected to the second terminal of the capacitance element 103 of each photo sensor circuit SC.

Next, the illustrative entire configuration of a photo sensor device 1 including plural photo sensor circuits SC and plural reset circuits RS, which are explained in FIG. 6, will be explained.
(Entire Configuration of Photo Sensor Device)

Figure 7:
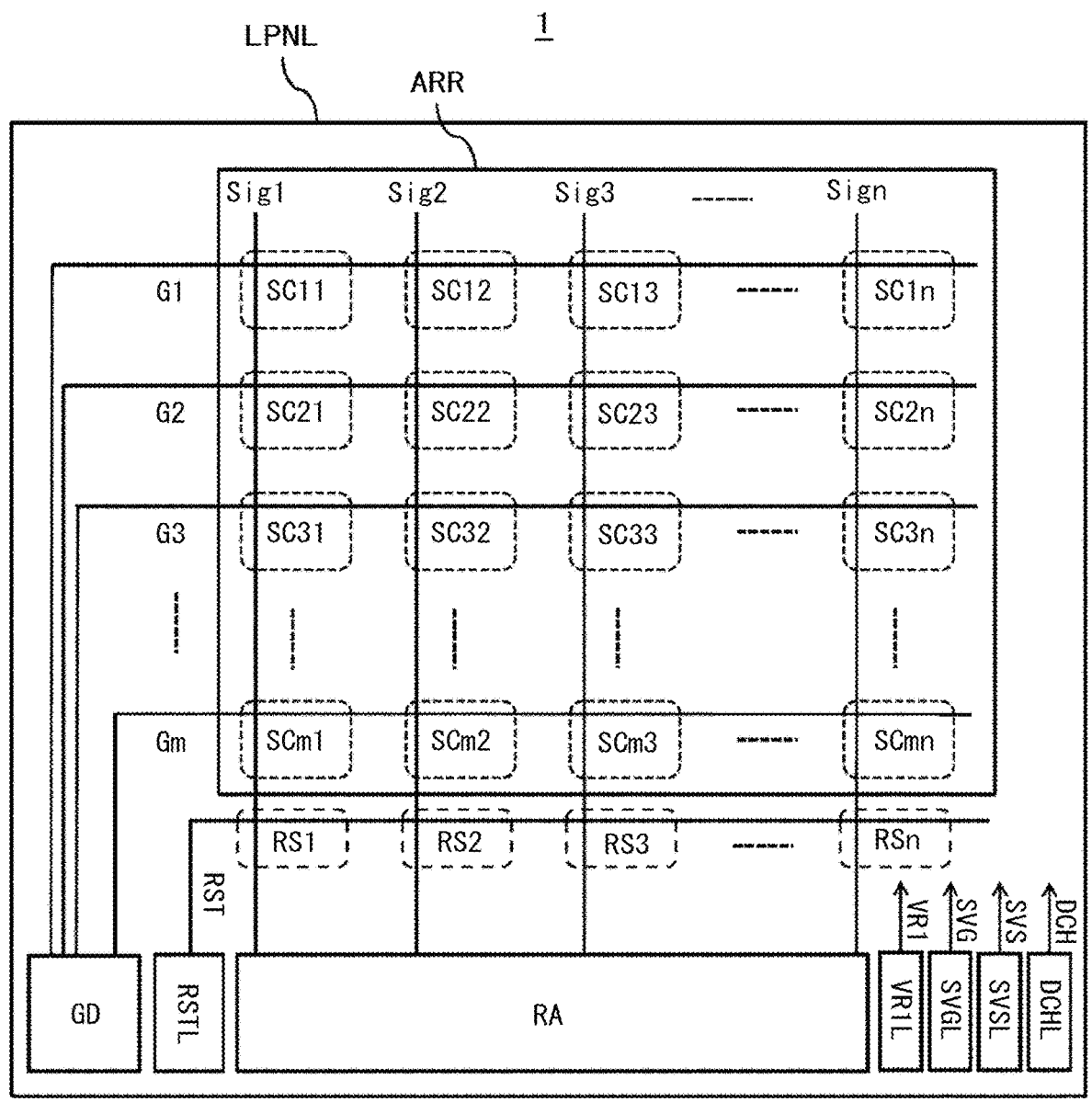
FIG. 7 is a block diagram showing the illustrative entire configuration of the photo sensor device according to the example.

FIG. 7 is a block diagram showing the illustrative entire configuration of the photo sensor device according to the example. Here, in order to avoid the complexity of the drawing, photo transistors 101, switching transistors 102 and 104, capacitance elements 103, and plural wirings (L1 top L4) except for gate lines G and signal lines S are not depicted in FIG. 7, although those are depicted in FIG. 6.

The photo sensor device 1 is formed, for example, on a photo sensor panel LPNL of a rectangular shape. An array unit ARR is formed on the photo sensor panel LPNL and formed in the array unit ARR are plural photo sensor circuits (SC11, SC12, ..., SCmn) that are disposed, for example, in an m-by-n matrix shape.

Corresponding to the number m of the rows, m gate lines G (G1, G2, G3, ..., Gm) are provided, and corresponding to the number n of the columns, n signal lines S (Sig1, Sig2, Sig3, ..., Sign) are provided.

The gate line G1 is connected to the photo sensor circuits SC11, SC12, SC13, ..., SC1n disposed in the first row, the gate line G2 is connected to the photo sensor circuits SC21, SC22, SC23, ..., SC2n disposed in the second row, and the gate line G3 is connected to the photo sensor circuits SC31, SC32, SC33, ..., SC3n disposed in the third row. In a similar way, any of the other gate lines is connected to plural photo sensor circuits disposed in the relevant row.

On the other hand, the signal line Sig1 is connected to the photo sensor circuits SC11, SC21, SC31, ..., SCm1 disposed in the first column, the signal line Sig2 is connected to the photo sensor circuits SC12, SC22, SC32, ..., SCm2 disposed in the second column, and the signal line Sig3 is connected to the photo sensor circuits SC13, SC23, SC33, ..., SCm3 disposed in the third column. In a similar way, any of the other signal lines is connected to plural photo sensor circuits disposed in the relevant column.

As described above, the plural photo sensor circuits are connected to the plural gate lines and the plural signal lines in such a way that one photo sensor circuit is connected to one gate line and one signal line.

Plural reset circuits (RS1, RS2, RS3, ..., RSn), a reset control circuit RSTL, a gate line drive circuit GD, and a readout circuit RA are formed in the peripheral region of a region, in which the array unit ARR is formed, on the photo sensor panel LPNL.

The plural reset circuits (RS1, RS2, RS3, ..., RSn) are provided corresponding to the respective columns on a one-to-one basis. The reset circuit RS1 is connected to the signal line Sig1, the reset circuit RS2 is connected to the signal line Sig2, and the reset circuit RS3 is connected to the signal line Sig3. In a similar way, any of the other reset circuits is connected to the relevant signal line. Furthermore, the reset signal RST output from the reset control circuit RSTL is input into the plural reset circuits (RS1, RS2, RS3, . . . , RSn) through a wiring.

The gate line drive circuit GD is connected to the m gate lines G (G1, G2, G3, . . . , Gm), and the gate line drive circuit GD has a function for setting a desired gate line of the m gate lines G (G1, G2, G3, . . . , Gm) in a selective level.

The readout circuit RA is connected to the n signal lines S (Sig1, Sig2, Sig3, . . . , Sign). For example, if the gate line drive circuit GD sets one gate line in a selective level in its readout operation, plural photo sensor circuits connected to the gate line, which are set in a selective level, are selected. As a result, charges stored in capacitance elements in the plural selected photo sensor circuits are input into the readout circuit RA as readout data via the n signal lines. It is possible for the readout circuit RA to have, for example, an analog-to-digital conversion function for converting analog signals to digital signals. In this case, analog signals such as the amounts of charges read out from the capacitance elements of the photo sensor circuits are converted into digital signals, and the digital signals can be transmitted, for example, to a host device.

In addition, a control circuit SVGL for generating the first gate control signal SVG, a control circuit SVSL for generating the first source control signal SVS, a control circuit DCHL for generating the second gate control signal DCH, and a control circuit VR1L for generating the second source control signal VR1 are formed in the peripheral region of the region, in which the array unit ARR is formed, on the photo sensor panel LPNL.

Next, the behavior of the photo sensor device 1 explained in FIG. 7 will be described.

(Drive Method of Photo Sensor Device)

Figure 8:
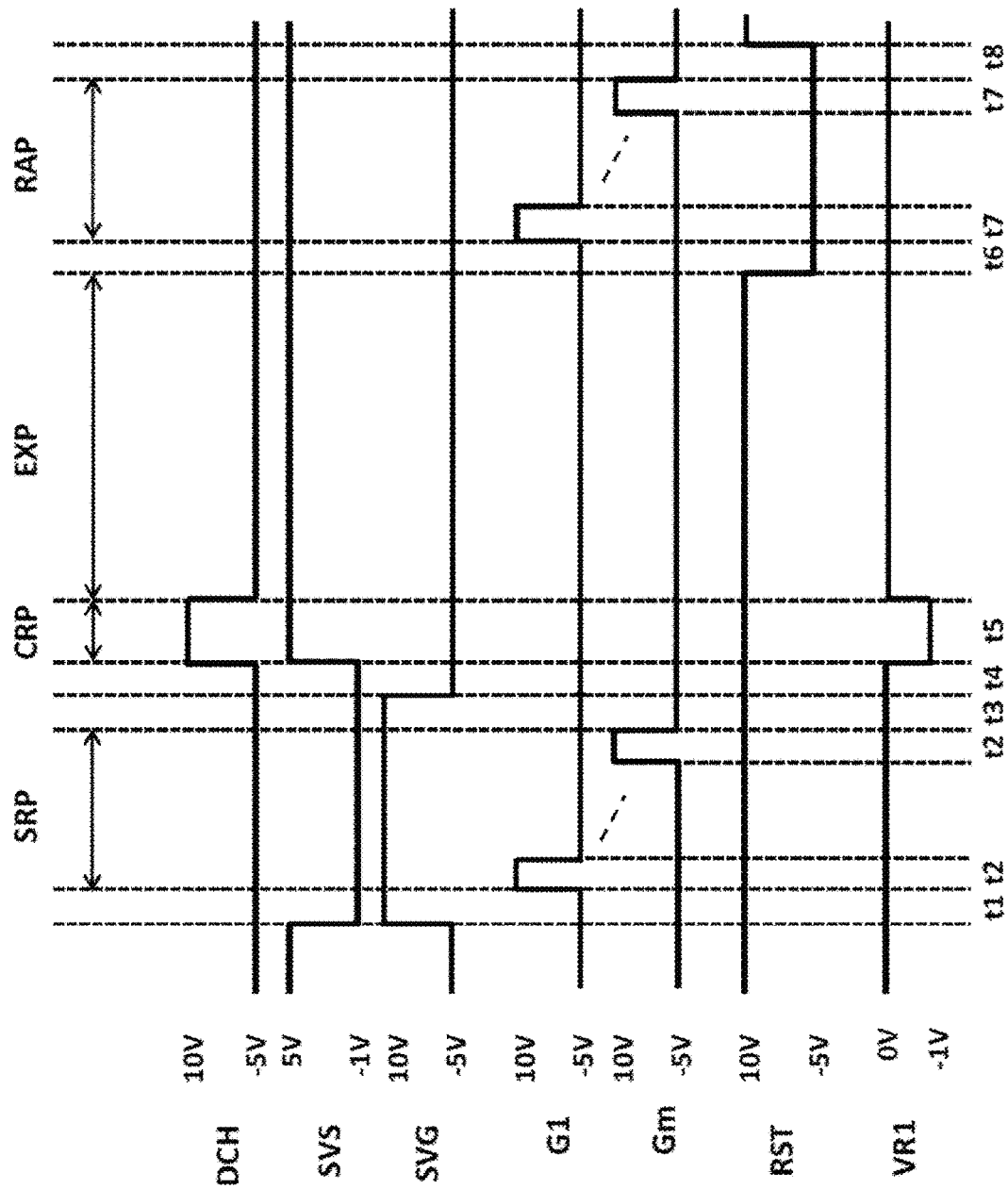
FIG. 8 is a timing chart for explaining the behavior example of the photo sensor device according to the example.

FIG. 8 is a timing chart for explaining the behavior example of the photo sensor device 1 according to the example. The timing chart shown in FIG. 8 shows one sensor sequence. The one sensor sequence includes: a sensor reset period SRP; a capacitor reset period CRP; an exposure period EXP; and a readout period RAP. Such a sensor sequence is executed, for example, continuously or several times in a predefined period, so that touch detection or fingerprint detection is executed.

The sensor reset period SRP is a period during which the photo response of the photo transistor 101 is disabled by flowing a reset current through the photo transistor 101 using the switching transistor 105, and the state of the photo transistor 101 is brought back to its initial state. During the sensor reset period SRP, the photoelectric current of the photo transistor 101 is instantaneously reset by turning the bias of the gate electrode of the photo transistor 101 positive.

The capacitor reset period CPR is a period that exists before the exposure period EXP and during which the charge stored in the capacitance element 103 is changed into a constant potential using the switching transistor 102.

The exposure period EXP is a period during which the photo transistor 101 is enabled to function as a light receiving element, and charge is stored in the capacitance element 103 in accordance with light amount irradiated from the incoming light LIG. During the exposure period EXP, sufficient signal intensity can be secured by turning the bias of the gate electrode of the photo transistor 101 negative.

The readout period RAP is a period during which a signal proportional to the light amount irradiated from the incoming light LIG is read out from the charge newly stored in the capacitance element 103 by turning the switching transistor 104 on after the exposure period EXP.

In such a way as above, it becomes possible to quantitatively detect the intensity of light irradiated from the incoming light LIG into the photo transistor 101.

One sensor sequence will be explained with reference to FIG. 8.

A period t1 shows a preparation period for preparation executed before the sensor reset period SRP. During the period t1, the first gate control signal SVG is set in a high level such as 10 V, and the reset signal RST is also set in a high level such as 10 V. Furthermore, the second gate control signal DCH is set in a low level such as −5 V, the first source control signal SVS is set in a low level such as −1 V, the second source control signal VR1 is set in a high level such as 0 V, and all the gate electrodes G1 to Gm are set in a low level (nonselective level) such as −5 V. Under this condition, the photo transistor 101 and the switching transistor 105 are in an on-state.

After the period t1, the sensor reset period SRP is started. There are plural periods t2 during the sensor reset period SRP. The periods t2 respectively show periods during which the levels of the gate electrodes (G1 to Gm) are respectively and sequentially shifted from a nonselective level such as −5 V to a selective level such as 10 V and afterward shifted to a nonselective level. When the gate electrode G1 is set in a selective level, the photo response of a photo transistor 101 in each of photo sensor circuits (SC11, SC12, . . . , SC1n), which are located in the first row and connected to the gate electrode G1, is disabled, and the photo transistor 101 is brought back to its initial state. When the gate electrode G2 is set in a selective level, the photo response of a photo transistor 101 in each of photo sensor circuits (SC21, SC22, . . . , SC2n), which are located in the second row and connected to the gate electrode G2, is disabled, and the photo transistor 101 is brought back to its initial state. Similar operations is executed when the other gate electrodes (G3 to Gm) are sequentially set in a selective level, so that the photo transistors 101 in all the photo sensor circuits of the sensor array ARR are brought back to their initial states. To put it concretely, the switching transistors 105, the switching transistors 104, and the photo transistors 101 are set in an on-state. Therefore, reset currents flow through wirings to which second source control signals VR1 are supplied to wirings to which first source control signals SVS are supplied via the source-drain channels of switching transistors 105, the signal lines (Sig1 to Sign), the source-drain channels of switching transistors 104, and the source-drain channels of photo transistors 101 respectively.

A period t3 shows a period during which the selection operations of all the gate electrodes (G1 to Gm) have already finished.

A period t4 is provided after the period t3 and shows a preparation period for preparation that is executed before a capacitance reset period CRP. During the period t4, the level of the first gate control signal SVG is shifted from a high level such as 10 V to a low level such as −5 V.

A period t5 shows a capacitance reset period CPF provided after the period t4. During the period t5, the level of the second gate control signal DCH is shifted from a low level such as −5 V to a high level such as 10 V, and the level of the second source control signal VR1 is shifted from a high level such as 0 V to a low level such as −1 V. In addition, the level of the first source control signal SVS is shifted from a low level such as −1 V to a high level such as 5 V. With this, in each of the photo sensor circuits (SC11, SC12, . . . , SCnm), a switching transistor 102 is set in an on-state, and the charge stored in a capacitance element 103 is discharged or charged so as to be changed into a constant potential.

The exposure period EXP is provided after the period t5. The exposure period EXP is started after the level of the second gate control signal DCH is shifted from a high level such as 10 V to a low level such as −5 V and the level of the second source control signal VR1 is shifted from a low level such as −1 V to a high level such as 0 V. At this time, the photo transistors 101, the switching transistors 102, and the switching transistors 104 in all the photo sensor circuits (SC11, SC12, . . . , SCnm) are set in an off-state. Under this condition, if the array unit ARR is irradiated with the incoming light LIG, each of the photo transistors 101 in the photo sensor circuits (SC11, SC12, . . . , SCnm) functions as a light receiving element, and charge is stored in the relevant capacitance element 103 in accordance with the light amount irradiated from the incoming light LIG. The end of the exposure period EXP is decided by shifting the level of the reset signal RST from a high level such as 10 V to a low level such as −5 V. In other words, the exposure period EXP can be decided by a time interval between a shift to the low level of the second gate control signal DCH and a shift to the low level of the reset signal RST. Therefore, the length of the exposure period EXP can be changed by controlling this time interval.

A period t6 is a preparation period before the readout period RAP. During the period t6, the reset signal RST is set in a low level.

After the period t6, the readout period RAP is started. The readout period RAP includes plural periods t7. The periods t7 respectively show periods during which the levels of the gate electrodes (G1 to Gm) are respectively and sequentially shifted from a nonselective level such as −5 V to a selective level such as 10 V and afterward shifted to a nonselective level. When the gate electrode G1 is set in a selective level, the charges newly stored in the respective capacitance elements 103 in the photo sensor circuits (SC11, SC12, . . . , SC1n), which are located in the first row and connected to the gate electrode G1, are read out to the signal lines Sig 1 to Sign by setting the relevant switching transistors 104 in an on-state, and input into the readout circuit RA. By sequentially setting the levels of all the gate electrodes (G1 to Gm) in a selective level, the charges of all the capacitance elements 103 of all the photo sensor circuits (SC11, SC12, . . . , SCnm) in the array unit ARR are input into the readout circuit RA.

A period t8 is provided after the end of the readout period RAP. After the period t8, the level of the reset signal RST is shifted from a low level to a high level, so that all the signals are set in states before the start of the period t1.

Figure 9:
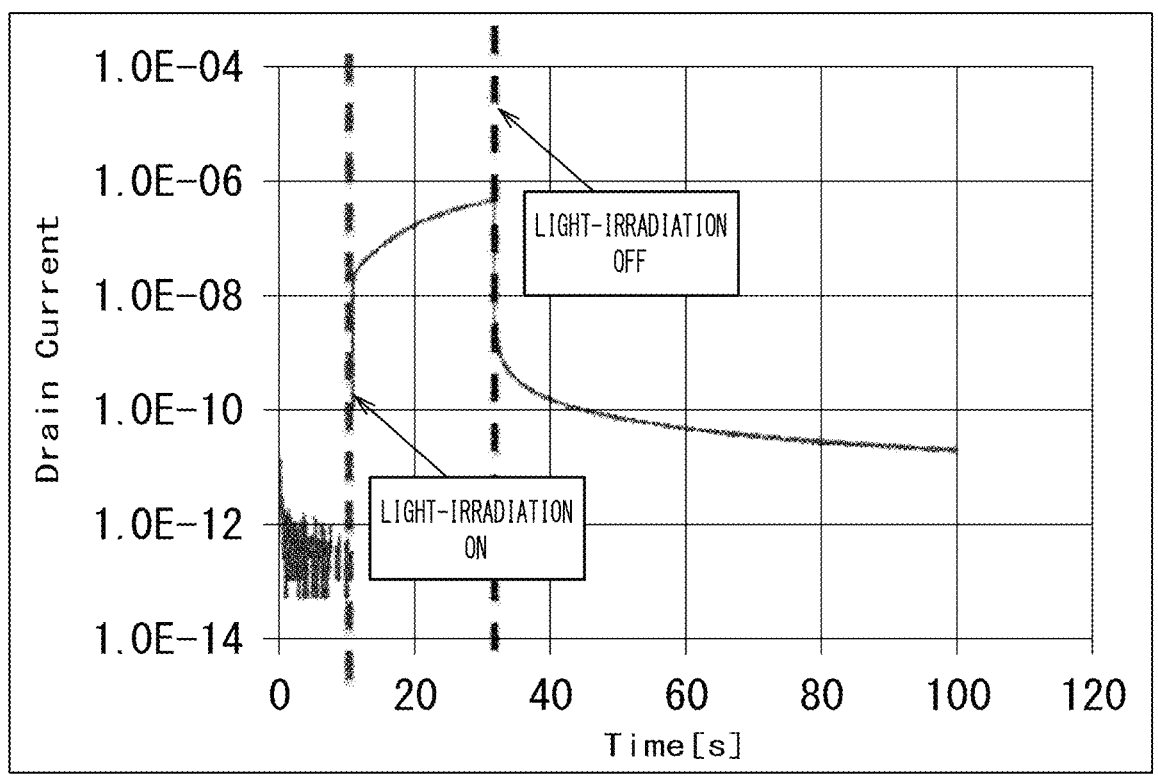
FIG. 9 is a characteristic diagram for explaining the characteristic of the photoelectric current of an oxide semiconductor transistor according to a comparative example.

FIG. 9 is a characteristic diagram for explaining the characteristic of a photoelectric current of an oxide semiconductor transistor according to a comparative example. In FIG. 9, the vertical axis represents a drain current and the horizontal axis represents time (second: s). FIG. 9 shows the change of the drain current (photoelectric current) in the case where a simple two-terminal element or an oxide semiconductor transistor into which a reset bias is not applied is irradiated with light during a period from 10 seconds to 30 seconds in the horizontal axis. As can be understood from FIG. 9, when the light is irradiated (light-irradiation ON), the drain current of the oxide semiconductor transistor increases, and when the irradiation of the light is stopped (light-irradiation OFF), the drain current of the oxide semiconductor transistor decreases, but the oxide semiconductor transistor has a characteristic that the drain current decreases very slowly even if the irradiation of the light is stopped (light-irradiation OFF). In other words, the characteristic of the oxide semiconductor transistor is that the drain current (photoelectric current), which once increased by the light irradiation, does not decrease quickly, and continues to have a high current value higher than the value of the drain current before the light irradiation for more than one hour.

Figure 10:
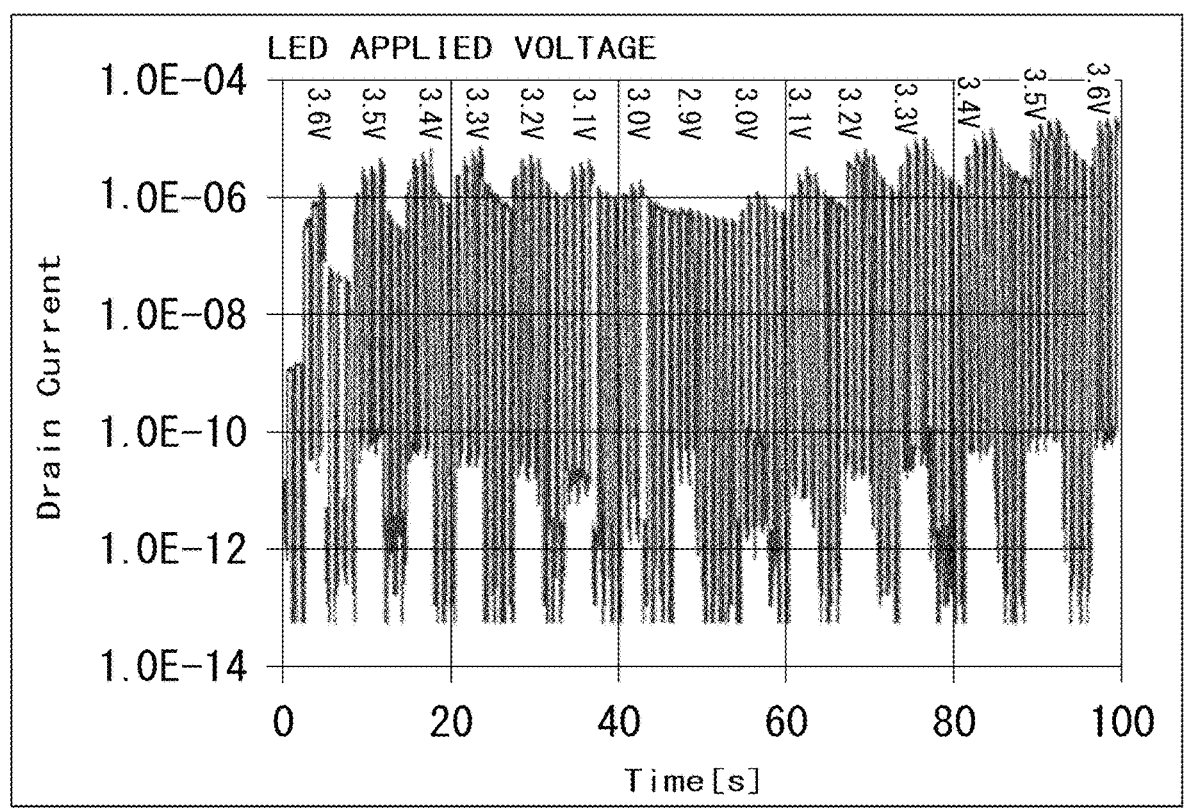
FIG. 10 is a diagram for explaining the photoelectric current of the oxide semiconductor transistor according to the comparative example.

FIG. 10 is a diagram for explaining the photoelectric current of the oxide semiconductor transistor according to the comparative example. In FIG. 10, the vertical axis represents a drain current and the horizontal axis represents time (second: s). Furthermore, applied voltages to an LED element adopted as a light emitting element are shown in the upper part of FIG. 10. To put it concretely, FIG. 10 shows the change of the drain current (photoelectric current) of an oxide semiconductor transistor in the case where a simple two-terminal element or the oxide semiconductor transistor into which a reset bias is not applied is irradiated with light while the light emitting amount of the LED element is being changed. As can be understood from FIG. 10, because the simple two-terminal element or the oxide semiconductor transistor into which a reset bias is not applied has a very slow light relaxation, stable signal intensity cannot be obtained, so that it is understandable that it is difficult to form a quantitative photo sensor element using an oxide semiconductor transistor.

Figure 11:
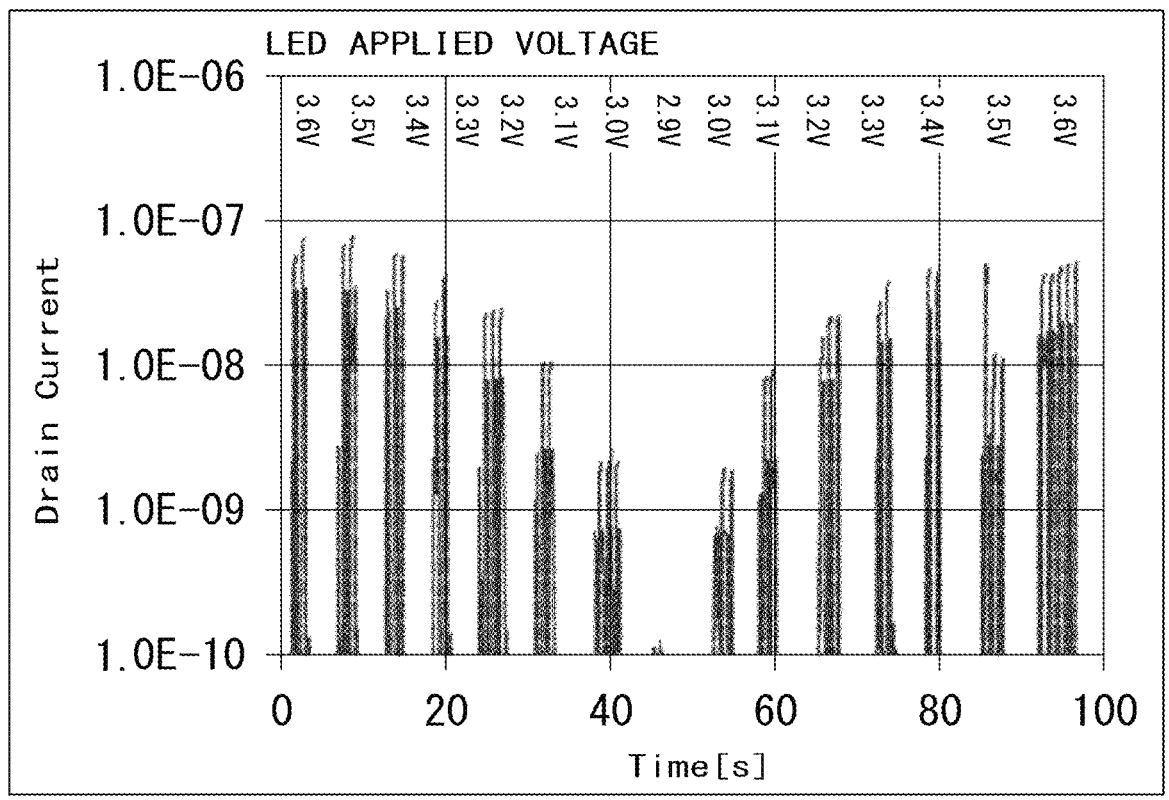
FIG. 11 is a diagram for explaining the photoelectric current of an oxide semiconductor transistor according to the example.

FIG. 11 is a diagram for explaining the photoelectric current of the oxide semiconductor transistor according to the example. In FIG. 11, the vertical axis represents a drain current and the horizontal axis represents time (second: s). Furthermore, applied voltages to an LED element are shown in the upper part of FIG. 11 as is the case with FIG. 10. FIG. 11 shows the change of the drain current (photoelectric current) of an oxide semiconductor transistor (the photo transistor) 101 in the case where an oxide semiconductor transistor 101 is adopted as the oxide semiconductor transistor, and a positive voltage is applied to the gate terminal G1 of the oxide semiconductor transistor 101 as a reset pulse at the time of sensing start or sensing stop. As can be understood from FIG. 11, if a positive voltage is applied to the gate terminal at the time of sensing start or sensing stop, the photoelectric current can be eliminated instantaneously. With this, a refresh period can be reduced to, for example, 100 msec or shorter. Therefore, stable signal intensity can be obtained, so that it becomes possible to form a quantitative photo sensor element using an oxide semiconductor transistor.

Figure 12:
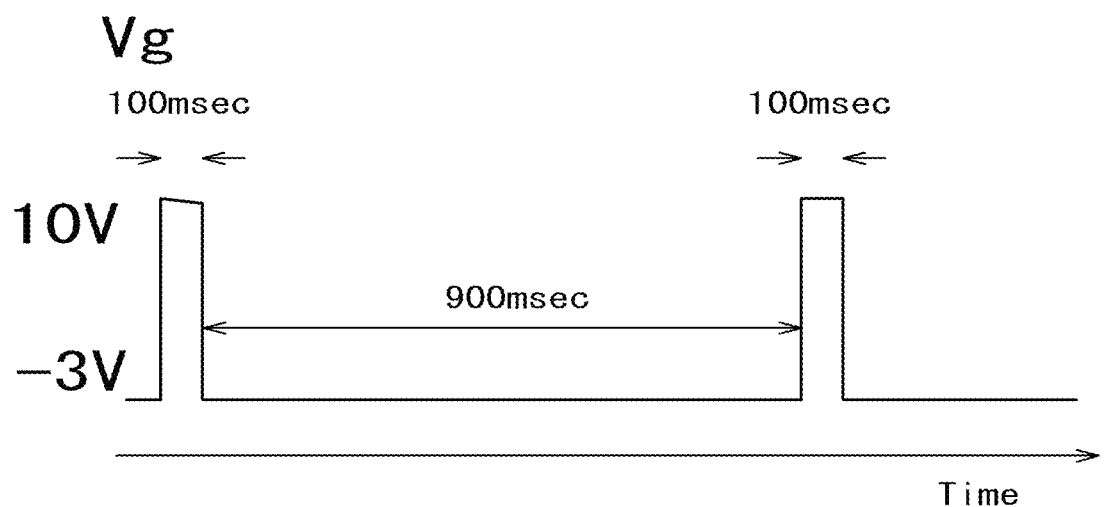
FIG. 12 is a diagram for illustratively showing the gate bias potential (Vg) of the gate electrode of the oxide semiconductor transistor at the time of a reset pulse being applied in FIG. 11.

FIG. 12 is a diagram for illustratively showing the gate bias potential (Vg) of the gate electrode of the oxide semiconductor transistor 101 at the time of the reset pulse being applied in FIG. 11. A positive potential, which is a high level voltage (10 V), can be applied as a reset pulse to the gate electrode of the oxide semiconductor transistor 101 for 100 msec, for example. In FIG. 12, a time interval between two reset pulses is illustratively set to 900 msec. Here, a period during which a reset pulse is in a high level in FIG. 12 can be considered to be equal to one period t2 in the sensor reset period SPR shown in FIG. 8.

Figure 13:
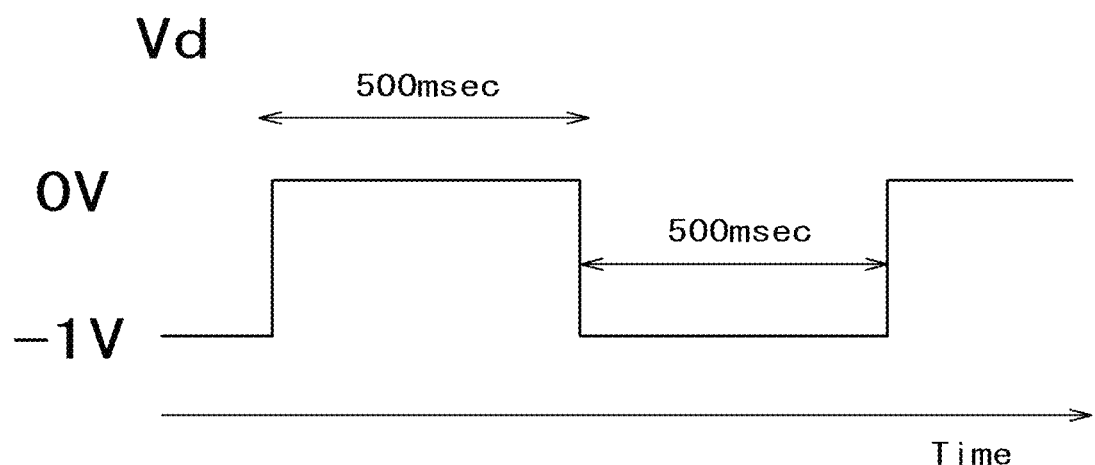
FIG. 13 is a diagram for illustratively showing the drain bias potential (Vd) of the drain electrode of the oxide semiconductor transistor at the time of the reset pulse being applied in FIG. 11.

FIG. 13 is a diagram for illustratively showing the drain bias potential (Vd) of the drain electrode of the oxide semiconductor transistor 101 at the time of the reset pulse being applied in FIG. 11. The drain electrode of the oxide semiconductor transistor 101 is set in a high level (0 V) for 500 msec, for example, and afterward the drain electrode is set in a low level (−1 V) for 500 msec, for example. Here, a period during which the bias potential (Vd) is set in a low level (−1 V) in FIG. 13 can be considered to be equal to the capacitance reset period CRP (period t5) shown in FIG. 8.

According to the example, the following one or plural advantageous effects can be obtained.

1) The photo transistor 101 is defined as an oxide semiconductor element including three terminals (a gate, a source, and a drain) with the oxide semiconductor layer 14b as a channel layer (an active layer). Because the photo transistor 101 has a three-terminal structure, the values of the drain currents (off currents) of the photo transistor 101 in an off-state can be used for judging whether there is light irradiation or not as shown in FIG. 4 and FIG. 5. This is because it becomes possible to detect whether there is light irradiation or not in a stable way by utilizing the fact that the signal ratios of the off-currents of the photo transistor 101 in the case of the presence of light irradiation to the off-currents in the case of the absence of light irradiation are large.

2) The switching transistor 102 (104 or 105) is defined as an oxide semiconductor element including four terminals (a gate, a source, a drain, and a back gate) with the oxide semiconductor layer 14a as a channel layer (an active layer). With this, the switching transistor 102 is configured in such a way that the oxide semiconductor layer 14a of the switching transistor 102 is not irradiated with the incoming light LIG. The back gate electrode 17 has a role of shielding or blocking the incoming light LIG into the oxide semiconductor layer 14a.

3) In the above description 2), it is also conceivable that the switching transistor 102 (104 or 105) adopts a dual gate drive scheme in which both gate electrode 12a and back gate electrode 17 are driven. In addition, it is also conceivable that the switching transistor 102 (104 or 105) is configured in such a way that the back gate electrode 17 is connected to the source electrode 15a. The switching transistor 102 (104 or 105) is not only limited to be configured as a bottom gate type, but also can be configured as a top gate type.

4) The photo sensor circuit includes the photo transistor 101; the switching transistors 102 and 104, and the capacitance element 103. The photo transistor 101 includes: the gate connected to the wiring to which the first gate control signal SVG is supplied; the source connected to the wiring to which the first source control signal SVS is supplied; and the drain. The switching transistor 102 includes: the gate connected to the wring to which the second gate control signal DCH is supplied; the source connected to the wiring to which the second source control signal VR1 is supplied; and the drain connected to the drain of the photo transistor 101. The capacitance element 103 includes: the first terminal connected to the drain of the photo transistor 101; and the second terminal connected to the source of the switching transistor 102. The switching transistor 104 includes: the gate connected to the gate line G1; and the source connected to the signal line Sig1; and the drain connected to the first terminal of the capacitance element 103. The charge stored in the capacitance element 103 is read out to the signal line Sig1 through the source-drain channel of the switching transistor 104 that is turned on when the gate line G1 is set in a selective level.

5) In the above description 4), the reset circuit RS is connected to the photo sensor circuit. The reset circuit RS includes the switching transistor 105. The switching transistor 105 includes: the gate connected to the wiring to which the reset signal RST is supplied; the source connected to the wiring to which the second source control signal VR1 is supplied; and the drain connected to the signal line Sig1.

6) In the behavior of the photo sensor device 1 including the photo sensor circuit and the reset circuit RST, one sensor sequence includes: the sensor reset period SRP; the capacitance reset period CRP; the exposure period EXP; and the readout period RAP. The sensor reset period SRP is a period during which the photo response of the photo transistor 101 is disabled by flowing a reset current through the photo transistor 101 using the switching transistor 105, and the state of the photo transistor 101 is brought back to its initial state. The capacitor reset period CPR is a period that exists before the exposure period EXP and during which the charge stored in the capacitance element 103 is changed into a constant potential (is initialized) using the switching transistor 102. The exposure period EXP is a period during which the photo transistor 101 is enabled to function as a light receiving element, and charge is stored in the capacitance element 103 in accordance with the light amount irradiated from the incoming light LIG. The readout period RAP is a period during which a signal proportional to the light amount irradiated from the incoming light LIG from the charge newly stored in the capacitance element 103 by turning the switching transistor 104 on after the exposure period EXP.

Because the sensor reset period SRP is prepared, the photoelectric current induced by the photo response of the photo transistor 101 can be eliminated in a short time. Furthermore, because the capacitance reset period CRP is prepared, the charge stored in the capacitance element 103 is changed into a constant potential (is initialized) before the exposure period EXP. With this, stable signal intensity can be obtained, so that it becomes possible to provide the photo sensor device 1 that can execute a stable behavior.

APPLICATION EXAMPLES

Next, application examples will be explained with reference to the accompanying drawings.

APPLICATION EXAMPLE 1

Figure 14:
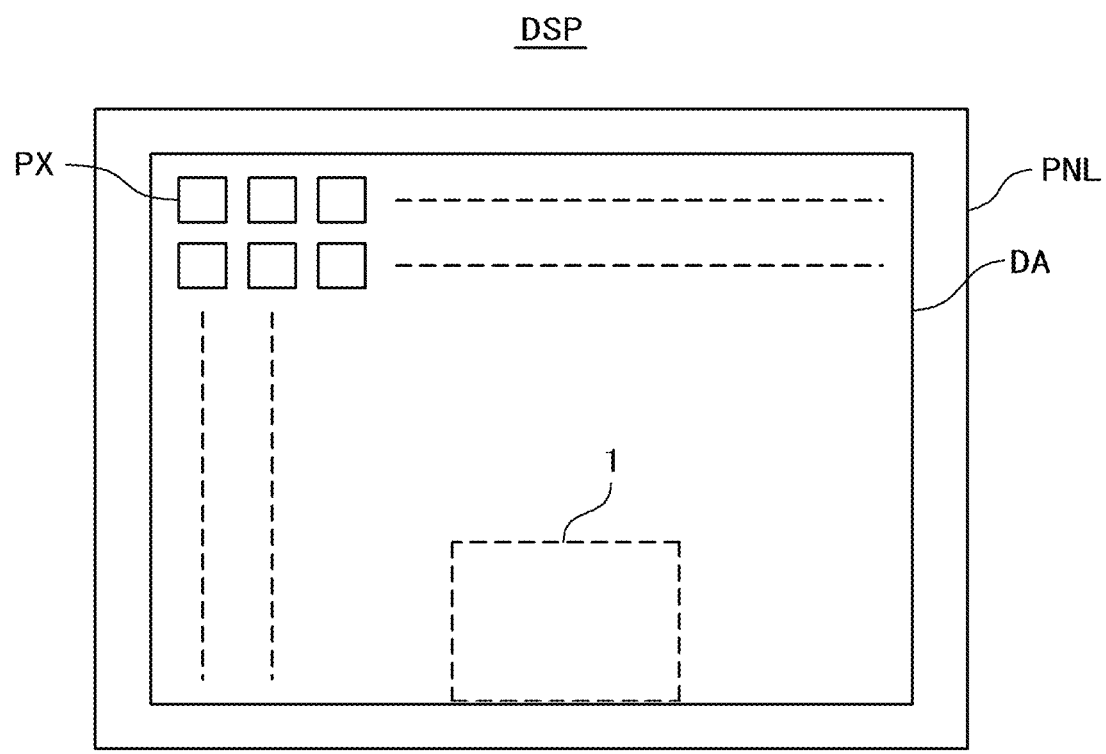
FIG. 14 is a plan view conceptually showing a display device according to Application Example 1.

FIG. 14 is a plan view conceptually showing a display device according to Application Example 1. The display device DSP according to Application Example 1 shows a configuration example of the photo sensor device 1 according to the example that is used as a fingerprint sensor. In this example, the photo sensor device 1 is pasted on a desired region of the display panel PNL of the display device DSP. This region is, for example, a region of the display panel PNL that is assigned to a fingerprint detection region. The display panel PNL includes a display region DA, and the display region DA includes plural display pixels PX disposed in a matrix shape. As the display panel PNL, a liquid crystal panel can be used, for example. In this case, liquid crystal display pixels can be used for the plural display pixels PX respectively.

APPLICATION EXAMPLE 2

Figure 15:
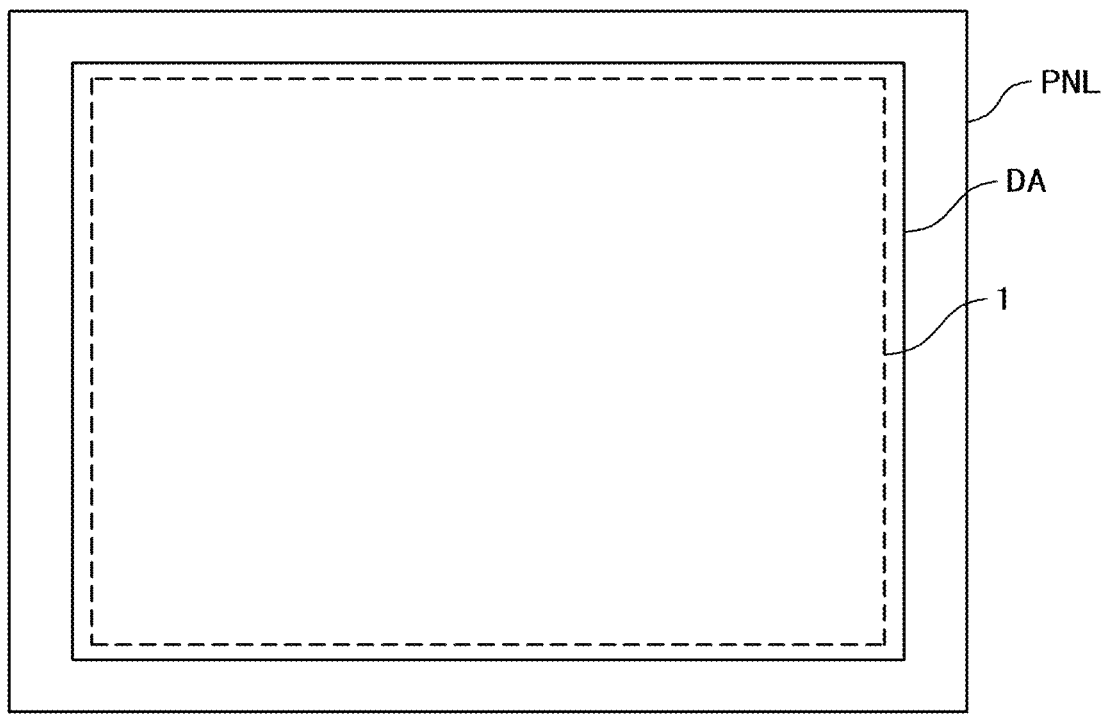
FIG. 15 is a plan view conceptually showing a display device according to Application Example 2.

FIG. 15 is a plan view conceptually showing a display device according to Application Example 2. The display device DSP1 according to Application Example 2 shows a configuration example of the photo sensor device 1 according to the example that is used as a touch sensor. In this example, the photo sensor device 1 is pasted on the display region DA of the display panel PNL of the display device DSP1. As is the case with Application Example 1, the display panel PNL includes the display region DA, and the display region DA includes plural display pixels PX disposed in a matrix shape. The photo sensor device 1 according to Application Example 2 can be used not only as the touch sensor, but also as a fingerprint sensor.

MODIFICATION EXAMPLE

Figure 16:
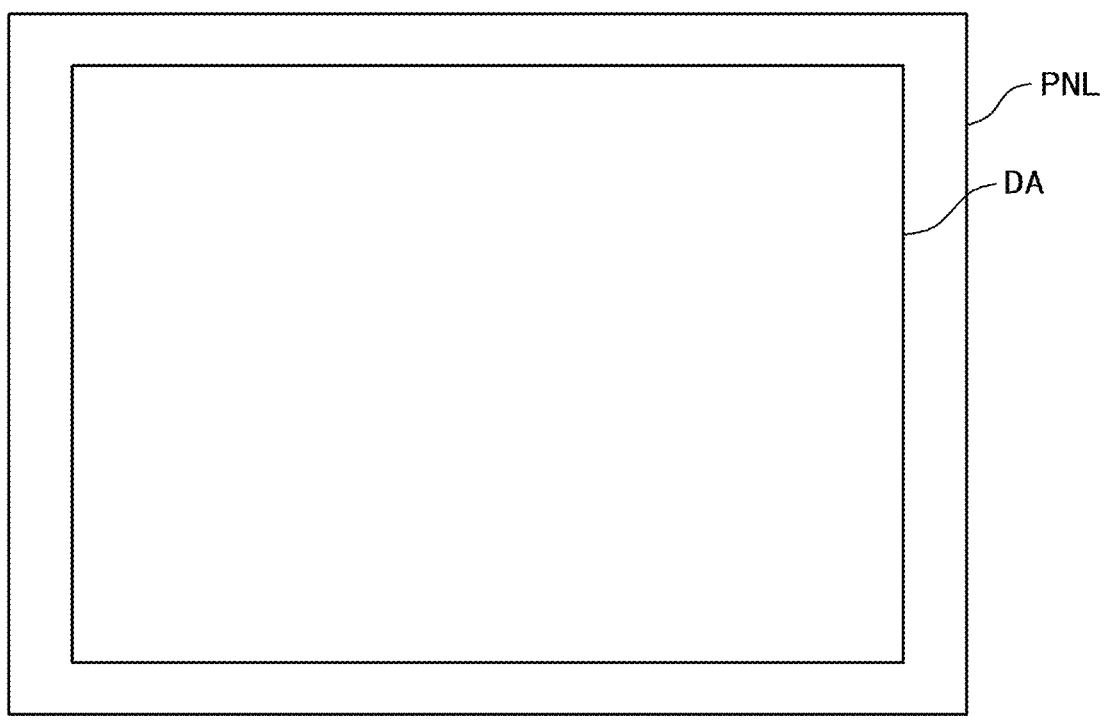
FIG. 16 is a plan view conceptually showing a display device according to a modification example.

FIG. 16 is a plan view conceptually showing a display device according to a modification example. In FIG. 14 and FIG. 15, the configuration example in which the photo sensor device 1 according to the example is pasted on the display region DA of the display panel PNL is shown. In a display device DSP2 according to the modification example, an example in which both display pixels PX and photo sensor circuits SC are formed in the display region DA of a display panel PNL is shown.

Figure 17:
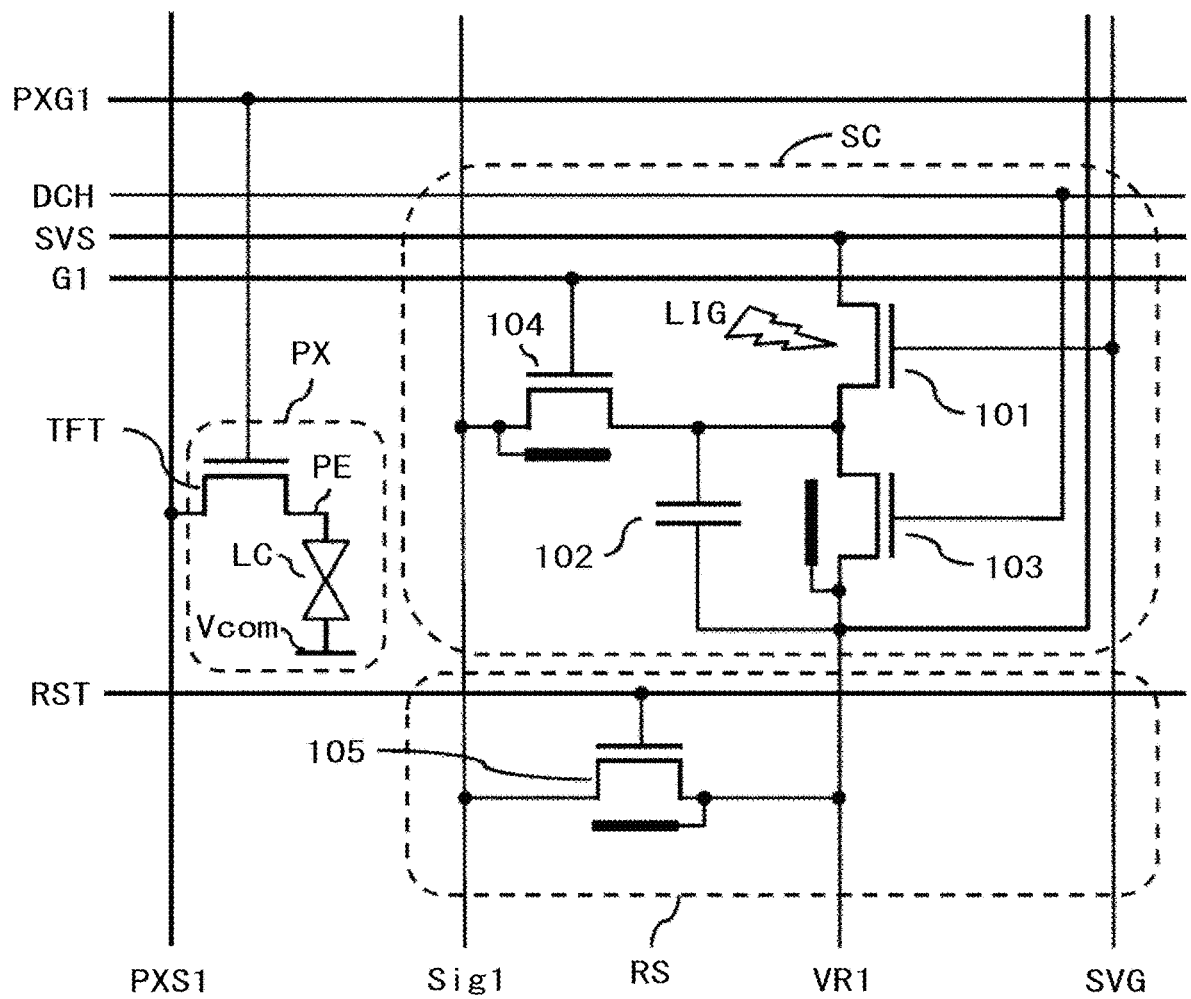
FIG. 17 is a circuit diagram showing a configuration example of a display pixel and a photo sensor circuit that can be adopted for the display device according to the modification example.

FIG. 17 is a circuit diagram showing a configuration example of a display pixel PX and a photo sensor circuit SC that can be adopted for the display device according to the modification example. FIG. 17 illustratively shows a configuration in which the photo sensor circuit SC shown in FIG. 6 and the display pixel PX are combined. Because the configuration of the photo sensor circuit SC is the same as that shown in FIG. 6, an explanation thereof will be omitted.

The display pixel PX includes one thin film transistor TFT as a switching element. The gate of the thin film transistor TFT is connected to a pixel gate line PXG1 that is a scanning line, one of the source/drain of the thin film transistor TFT is connected to a pixel source line PXS1 that is a signal line, and the other of the source/drain is connected to a pixel electrode PE. In addition, a common electrode Vcom, which gives a common potential Vcom to all display pixels PX, is provided for the display pixel PX, and a liquid crystal layer LC is provided between the pixel electrode PE and the common electrode Vcom. The display pixel PX is configured in such a way that the thin film transistor TFT is turned on or off on the basis of a drive signal supplied through the pixel gate line PXG1, and when the thin film transistor TFT is in an on-state, a pixel voltage is applied to the pixel electrode PE on the basis of a display signal supplied from the pixel source line PXS1, so that the liquid crystal layer LC is driven by an electric field between the pixel electrode PE and the common electrode Vcom.

Although FIG. 17 shows the configuration in which one photo sensor circuit SC is provided for one display pixel PX, this combination is not only one. One photo sensor circuit SC can be provided for plural display pixels PX. For example, one photo sensor circuit SC can be provided for five display pixels PX.

In the application examples and the modification example, a liquid crystal display device is disclosed as an example of a display device. This liquid crystal device can be used for various kinds of devices such as a smart phone; a tablet terminal; a cellular phone terminal; a personal computer; a TV receiver; an in-vehicle device, a game machine; a digital camera; and a video camera. Here, the main configurations disclosed in the application examples and the modification example can be applied to a self-luminous type display device (OLED) including organic electroluminescence display elements and the like; an electronic paper type display device including electrophoretic elements and the like; a display device using MEMS (Micro Electro Mechanical Systems); a display device using electrochromism; and the like.

Because the photo transistor 101 using an oxide semiconductor layer has a very low off current as shown in FIG. 4, the photo transistor 101 can hold a very low off current if there is no light irradiation. Therefore, it is also possible that an exposure time (exposure period EXP) and a readout time (readout period RAP) are changed freely in accordance with an object or irradiated light (a global shutter). For example, in the case where a combination of a display device using OLEDs and a display device using liquid crystals is used, it is possible to drive the photo sensor device 1 or independently activate the photo sensor device 1 between the display operations of the display device using OLEDs or the display device using liquid crystals. Furthermore, if a short readout time (readout period RAP) is adopted, thin film transistors (TFT) of polycrystalline low temperature polysilicon (LIPS) can be used for the readout transistor (the switching transistor) 104 and the reset transistor 105.

All kinds of photo sensor devices and display devices that can be obtained by those skilled in the art through appropriately modifying designs on the basis of the photo sensor devices and display devices described above as the embodiments of the present invention fall within the scope of the present invention as long as these kinds of photo sensor devices and display devices do not deviate from the gist of the present invention.

It should be understood that, if various alternation examples and modification examples are easily conceived by those skilled in the art in the idea of the present invention, those alternation examples and modification examples also fall within the scope of the present invention. For example, devices obtained in the case where those skilled in the art appropriately add components to the above-described various embodiments, delete components from the above-described various embodiments, add processes to original processes for the above-described various embodiments, omit processes from the original processes, or alter conditions for implementing the above-described various embodiments fall within the scope of the present invention as long as the devices do not deviate from the gist of the present invention.

In addition, it should be obviously understood that other operational effects, which are brought about by the above-described embodiments, clear from the descriptions of the present specification, and can be accordingly conceived by those skilled in the art, are brought about by the present invention.

Various inventions can be achieved by appropriately combining plural components disclosed in the above-described embodiments. For example, a new invention will be achieved by deleting some components from all the components included in one of the above-described embodiments. Alternatively, another new invention will be achieved by appropriately combining components from the above-described embodiments.

REFERENCE SIGNS LIST

1 . . . Photo Sensor Device,
SC . . . Photo Sensor Circuit,
LIG . . . Incoming Light,
101 . . . Photo Transistor,
102, 104, 105 . . . Switching Transistor,
103 . . . Capacitance Element,
14a, 14b . . . Oxide Semiconductor Layer (Channel Layer),
12a, 12b . . . Gate Electrode,
15a, 15b, 15c . . . Drain Electrode and Source Electrodes,
17 . . . Back Gate Electrode,
RS . . . Reset Circuit,
DSP . . . Display Device

The invention claimed is:

1. A photo sensor device comprising:
a gate line, a signal line, and photo sensor circuit disposed on a substrate,
wherein
the photo sensor circuit includes a photo transistor, a first switching transistor, a second switching transistor and a capacitance element,
the first switching transistor has a first oxide semiconductor layer, a first gate electrode and a gate insulation film between the first oxide semiconductor layer and the first gate electrode,
the photo transistor has an oxide semiconductor layer for the photo transistor, a gate electrode for the photo transistor and the gate insulation film,
the capacitance element has a first terminal and a second terminal,
the first oxide semiconductor layer and the oxide semiconductor layer for the photo transistor are disposed same layer,
the first gate electrode, the gate electrode for the photo transistor and the first terminal are disposed same layer,
a drain electrode of the photo transistor connects to a first drain electrode of the first switching transistor, and
the second switching transistor has a second gate electrode connected to the gate line, a second source electrode connects to the signal line and a second semiconductor layer.

2. The photo sensor device according to claim 1, wherein
a reset circuit includes a third switching transistor,
the third switching transistor includes a third gate electrode supplied a reset signal, a drain electrode connected to the signal line and a third semiconductor layer.

3. The photo sensor device according to claim 1,
wherein the second semiconductor layer is oxide semiconductor layer as a channel layer.

4. The photo sensor device according to claim 2,
wherein the third semiconductor layer is oxide semiconductor layer as a channel layer.

5. The photo sensor device according to claim 1,
wherein the first switching transistor has a first back gate electrode.

6. The photo sensor device according to claim 1,
wherein the second switching transistor has a second back gate electrode.

7. The photo sensor device according to claim 2,
wherein the third switching transistor has a third back gate electrode.

* * * * *